(12) United States Patent
Usami et al.

(10) Patent No.: US 7,898,540 B2
(45) Date of Patent: Mar. 1, 2011

(54) METHOD AND PROGRAM FOR CONVERTING BOUNDARY DATA INTO CELL INNER SHAPE DATA

(75) Inventors: Shugo Usami, Saitama (JP); Kiwamu Kase, Saitama (JP); Yoshinori Teshima, Saitama (JP)

(73) Assignee: Riken, Saitama (JP)

( * ) Notice: Subject to any disclaimer, the term of this patent is extended or adjusted under 35 U.S.C. 154(b) by 1317 days.

(21) Appl. No.: 11/419,847

(22) Filed: May 23, 2006

(65) Prior Publication Data
US 2007/0058455 A1 Mar. 15, 2007

(30) Foreign Application Priority Data
Sep. 12, 2005 (JP) ............................. 2005-263163

(51) Int. Cl.
*G06T 17/00* (2006.01)
(52) U.S. Cl. ..................................................... 345/424
(58) Field of Classification Search .................. 345/424
See application file for complete search history.

(56) References Cited

U.S. PATENT DOCUMENTS

| | | | |
|---|---|---|---|
| 4,092,201 A | | 5/1978 | Wommelsdorf |
| 4,665,492 A | | 5/1987 | Masters |
| 4,694,404 A | | 9/1987 | Meagher |
| 4,710,876 A | * | 12/1987 | Cline et al. .................. 345/423 |
| 4,719,585 A | | 1/1988 | Cline et al. |
| 4,729,098 A | * | 3/1988 | Cline et al. .................. 345/421 |
| 5,095,419 A | | 3/1992 | Seki et al. |
| 5,166,876 A | * | 11/1992 | Cline et al. .................. 345/424 |
| 5,197,013 A | | 3/1993 | Dundorf |
| 5,303,141 A | | 4/1994 | Batchelder et al. |
| 5,345,490 A | * | 9/1994 | Finnigan et al. .................. 378/4 |
| 5,510,066 A | | 4/1996 | Fink et al. |
| 5,517,602 A | * | 5/1996 | Natarajan .................... 345/419 |

(Continued)

FOREIGN PATENT DOCUMENTS

EP 0 938 949 9/1999

(Continued)

OTHER PUBLICATIONS

Poston et al., 'Skeleton Climbing': fast isosurfaces with fewer triangles, 1997, IEEE, pp. 117-126.*

(Continued)

*Primary Examiner* — Daniel Washburn
(74) *Attorney, Agent, or Firm* — Griffin & Szipl, P.C.

(57) ABSTRACT

A cutting point calculation step defines the cell complex that contains the boundary data, and calculating a cutting point where the boundary data cuts an edge or vertex of the rectangular parallelepiped cell of the cell complex. A cycle formation step classifies the rectangular parallelepiped cells into a boundary cell having the cutting point and a nonboundary cell having no cutting point, acquiring a cutting segment between a cell surface and boundary data for each boundary cell, and forming a cutting segment cycle closed by connecting the cutting points and the cutting segments alternately in sequence. A cycle internal division step divides the inside of the cutting segment cycle into cycle inner triangles sharing an adjacent side, for each boundary cell. A simplification step of unifying a plurality of cutting points on each edge, and registering the cycle inner triangles in the cell, for each boundary cell.

7 Claims, 8 Drawing Sheets

U.S. PATENT DOCUMENTS

| | | | |
|---|---|---|---|
| 5,594,652 A | 1/1997 | Penn et al. | |
| 5,748,865 A | 5/1998 | Yamamoto et al. | |
| 5,796,617 A | 8/1998 | St. Ville | |
| 5,807,448 A | 9/1998 | Nakazawa | |
| 5,835,379 A | 11/1998 | Nakano | |
| 5,898,793 A * | 4/1999 | Karron et al. | 382/131 |
| 6,075,538 A * | 6/2000 | Shu et al. | 345/419 |
| 6,136,252 A | 10/2000 | Bedal et al. | |
| 6,208,545 B1 | 3/2001 | Leedy | |
| 6,214,279 B1 | 4/2001 | Yang et al. | |
| 6,405,095 B1 | 6/2002 | Jang et al. | |
| 6,445,390 B1 | 9/2002 | Aftosmis et al. | |
| 6,448,968 B1 * | 9/2002 | Pfister et al. | 345/423 |
| 6,471,800 B2 | 10/2002 | Jang et al. | |
| 6,504,742 B1 | 1/2003 | Tran et al. | |
| 6,606,528 B1 | 8/2003 | Hagmeier et al. | |
| 6,618,607 B2 | 9/2003 | Song | |
| 6,627,835 B1 | 9/2003 | Chung et al. | |
| 6,639,597 B1 | 10/2003 | Zwicker et al. | |
| 6,643,560 B2 | 11/2003 | Shimomura | |
| 6,968,075 B1 | 11/2005 | Chang | |
| 6,982,710 B2 * | 1/2006 | Salomie | 345/420 |
| 7,088,363 B2 | 8/2006 | Kase et al. | |
| 7,110,852 B2 | 9/2006 | Ohmori et al. | |
| 7,173,616 B2 * | 2/2007 | Boekhorst | 345/424 |
| 7,321,366 B2 * | 1/2008 | Teshima et al. | 345/424 |
| 7,333,104 B2 * | 2/2008 | Kase et al. | 345/420 |
| 7,372,460 B2 * | 5/2008 | Usami et al. | 345/419 |
| 7,388,584 B2 * | 6/2008 | Kase | 345/424 |
| 7,430,500 B2 * | 9/2008 | Lei et al. | 703/9 |
| 7,538,764 B2 * | 5/2009 | Salomie | 345/420 |
| 7,734,059 B2 * | 6/2010 | Kase et al. | 382/100 |
| 2002/0004713 A1 | 1/2002 | Wakabayashi et al. | |
| 2002/0055692 A1 | 5/2002 | Tanaka et al. | |
| 2002/0113331 A1 | 8/2002 | Zhang et al. | |
| 2003/0001836 A1 | 1/2003 | Ernst et al. | |
| 2004/0267400 A1 | 12/2004 | Ohmori et al. | |
| 2005/0015173 A1 | 1/2005 | Ohmori et al. | |
| 2005/0107992 A1 * | 5/2005 | Kase et al. | 703/2 |
| 2005/0151735 A1 * | 7/2005 | Boekhorst | 345/424 |
| 2005/0219245 A1 * | 10/2005 | Tao | 345/424 |
| 2006/0089803 A1 * | 4/2006 | Lei et al. | 702/1 |
| 2006/0228248 A1 | 10/2006 | Larsson | |
| 2007/0233432 A1 * | 10/2007 | Kase et al. | 703/1 |
| 2009/0040217 A1 * | 2/2009 | Kase et al. | 345/420 |

FOREIGN PATENT DOCUMENTS

| | | |
|---|---|---|
| EP | 1 229 463 | 8/2002 |
| JP | 02-236677 | 9/1990 |
| JP | 03-021432 | 1/1991 |
| JP | 04-075850 | 3/1992 |
| JP | 06-315849 | 11/1994 |
| JP | 06-348862 | 12/1994 |
| JP | 07-057089 | 3/1995 |
| JP | 07-334541 | 12/1995 |
| JP | 10-063873 | 3/1998 |
| JP | 11-096400 | 4/1999 |
| JP | 2000-182081 | 6/2000 |
| JP | 2000-194881 | 7/2000 |
| JP | 2000-340476 | 12/2000 |
| JP | 2001-022961 | 1/2001 |
| JP | 2001-025023 | 1/2001 |
| JP | 2001-370040 | 4/2001 |
| JP | 2001-225393 | 8/2001 |
| JP | 2002-024306 | 1/2002 |
| JP | 02/23408 A1 | 3/2002 |
| JP | 2002-230054 | 8/2002 |
| JP | 2003-044528 | 2/2003 |
| JP | 3468464 | 9/2003 |
| JP | 2004-334640 | 11/2004 |
| JP | 2005-038219 | 2/2005 |
| WO | 03/048980 | 6/2003 |
| WO | 03/007335 | 9/2003 |
| WO | 03/073335 | 9/2003 |

OTHER PUBLICATIONS

Kase et al., Volume CAD, 2003, The Eurographics Association, pp. 145-173.*
Poston et al., Multiresolution Isosurface Extraction with Adaptive Skeleton Climbing, 1998, The Eurographics Association and Blackwell Publishers, vol. 17, No. 3, pp. 1-13.*
Office Action issued in related U.S. Appl. No. 10/482,919 dated Feb. 7, 2007.
Office Action dated Apr. 8, 2008 issued in related U.S. Appl. No. 11/419,847.
Kobbelt, Leif P. et al., "Feature Sensitive Surface Extraction from Volume Data," ACM SIGGRAPH 2001, Aug. 12-17, 2001, pp. 47-66.
Brunet, Pere et al., "Solid Representation and Operation Using Extended Octrees," ACM Transactions on Graphics, vol. 9, No. 2, Apr. 1990, pp. 170-197.
Pfister, Hanspeter et al., "Cube-4—A Scalable Architecture for Real-Time Volume Rendering," IEEE 1996, pp. 47-54,100.
Wallin, Ake, "Constructing Isosurfaces from CT Data," IEEE Computer Graphics & Applications, IEEE 1991, pp. 28-33.
Office Action dated May 7, 2007 in related U.S. Appl. No. 10/486,653.
Office Action issued in related U.S. Appl. No. 10/505,224, dated Jan. 24, 2007.
Haley, Michael B., "Incremental Volume Rendering Using Hierarchical Compression," Eurographics '96 vol. 15, No. 3, 1996, pp. 45-55.
Ward, Gregory J., "The RADIANCE Lighting Simulation and Rendering System," Computer Graphics Proceedings, Annual Conference Series, 1994, pp. 459-472.
Roy, Uptal et al., "3-D Object Decomposition with Extended Octree Model and its Application in Geometric Simulation of NC Machining," Robotics and Computer-Integrated Manufacturing 14, 1998, pp. 317-327.
Shepard, M.S. et al., "Parallel Automatic Adaptive Analysis," Parallel Computing 23, 1997, pp. 1327-1347.
European Search Report issued in related application No. EP 02743831.6, completed Mar. 23, 2007 and mailed Apr. 3, 2007.
Okamoto, Katsunari et al., "Stress Analysis of Optical Fibers by a Finite Element Method," Oct. 1981, IEEE vol. QE-17, No. 10, pp. 2123-2129.
Office Action issued in related U.S. Appl. No. 10/482,919, dated Jun. 29, 2007.
Hoppe, Hugues, "Progressive Meshes," Aug. 1996.
Kase, K. et al., "Volume CAD," Volume Graphics, 2003, pp. 145-173.
Piegl, Leslie et al., "Tessellating trimmed NURBS surfaces," Computer-Aided Design, Jan. 1995, pp. 16-26, vol. 27, No. 1, Great Britain.
Renze, Kevin J. et al, "Generalized Surface and Volume Decimation for Unstructured Tessellated Domains," Proceedings of VRAIS, 1996, pp. 111-121.
Schroeder, William J., "A Topology Modifying Progressive Decimation Algorithm," Oct. 1997.
Schroeder, William J. et al, "Decimation of Triangle Meshes," Computer Graphics, Jul. 3, 1992, pp. 65-70, vol. 26.
"Developing Volume-CAD as the basis for next generation manufacturing," Riken News, Mar. 2005, No. 285.
Avila, Ricardo S., et al., "A Haptic Interaction Method for Volume Visualization," Oct. 27, 1996, pp. 197-204.
Ayala, D., et al., "Object Representation by Means of Nonminimal Division Quadtrees and Octrees," ACM Transactions on Graphics, Jan. 1985, pp. 41-59, vol. 4, No. 1.
Kase, Kiwamu, et al., "Volume CAD-CW-complexes based approach," Computer Aided Design, May 18, 2005, pp. 1-12.
Kela, Ajay, "Hierarchical octree approximations for boundary representation-based geometric models," Computer-Aided Design, Jul./Aug. 1989, No. 6, London.

Lorenson, William E., et al., "Marching Cubes: A High Resolution 3D Surface Construction Algorithm," Computer Graphics, Jul. 1987, pp. 163-169, vol. 21, No. 4.

Roy, U., et al., "Computation of a geometric model of a machined part from its NC machining programs," Computer-Aided Design, 1999, pp. 401-411, No. 31.

Shute, Gary, "Overview of C Programming," Aug. 23, 1999, http://www.d.umn.edu/~gshute/C/overview.html, last printed Nov. 1, 2004.

Yamaguchi, K. et al, "Computer-Integrated Manufacturing of Surfaces Using Octree Encoding," Jan. 1984, pp. 60-62.

Zesheng, Tang, "Octree Representation and Its Applications in CAD," Journal of Computer Science and Technology, 1992, pp. 29-38, vol. 7, No. 1.

Office Action issued in related U.S. Appl. No. 10/482,919, dated Aug. 26, 2008.

Yonekawa, Kazutoshi et al., "A Geometric Modeler by Using Spatial Partitioning Representations," Jan. 1996, vol. 37, No. 1.

Ramesh, R., et al. "Error compensation in machine tools—a review Part 1: geometric, cutting-force induced and fixture-dependent errors," International Journal of Machine Tools & Manufacture 40 (2000) pp. 1235-1256.

Liu, Qing, "Form-Accuracy Analysis and Prediction in Computer-Integrated Manufacturing," International Journal of Machine Tools & Manufacture, vol. 37, No. 3, 1997, pp. 234-248.

Supplementary European Search Report issued in related application No. EP 02 76 0631, completed Sep. 12, 2007.

Office Action issued in related U.S. Appl. No. 10/486,653, dated Oct. 18, 2007.

Office Action issued in related U.S. Appl. No. 10/595,047, dated Sep. 28, 2007.

Hoffmann, Christoph M., "The Problems of Accuracy and Robustness in Geometric Computation", Mar. 1989, pp. 31-41.

Navazo, I. et al., "A Geometric Modeller based on the Exact Octtree Representation of Polyhedra", Computer Graphics Forum 5, pp. 91-104, 1986.

Navazo, I., "Extended Octtree Representation of General Solids with Plane Faces; Model Structure and Algorithms", Comput. & Graphics, vol. 13, No. 1, pp. 5-16, 1989.

Webster's Collegiate Dictionary, Definition of the term "origin," 1977, pp. 809-810.

* cited by examiner

PRIOR ART

METHOD AND PROGRAM FOR CONVERTING BOUNDARY DATA INTO CELL INNER SHAPE DATA

This application claims priority from Japanese Patent Application No. 263163/2005, filed Sep. 12, 2005, the entire disclosure of which is incorporated herein by reference.

BACKGROUND OF THE INVENTION

1. Technical Field of the Invention

The present invention relates to a method for generating volume data that enables CAD and simulation to be unified by storing the volume data that includes shapes and physical properties with a small storage capacity, and more particularly to a method and program for converting boundary data of an object, which has been input to a computer, into cell inner shape data in a cell complex, which is composed of rectangular parallelepiped cells each having boundary surfaces crossing each other without gaps between the rectangular parallelepiped cells.

2. Description of the Related Art

The present inventor et al. devised and applied for a patent on a "method for storing substantial data that includes shapes and physical properties" (Patent Document 1).

Figure 8:
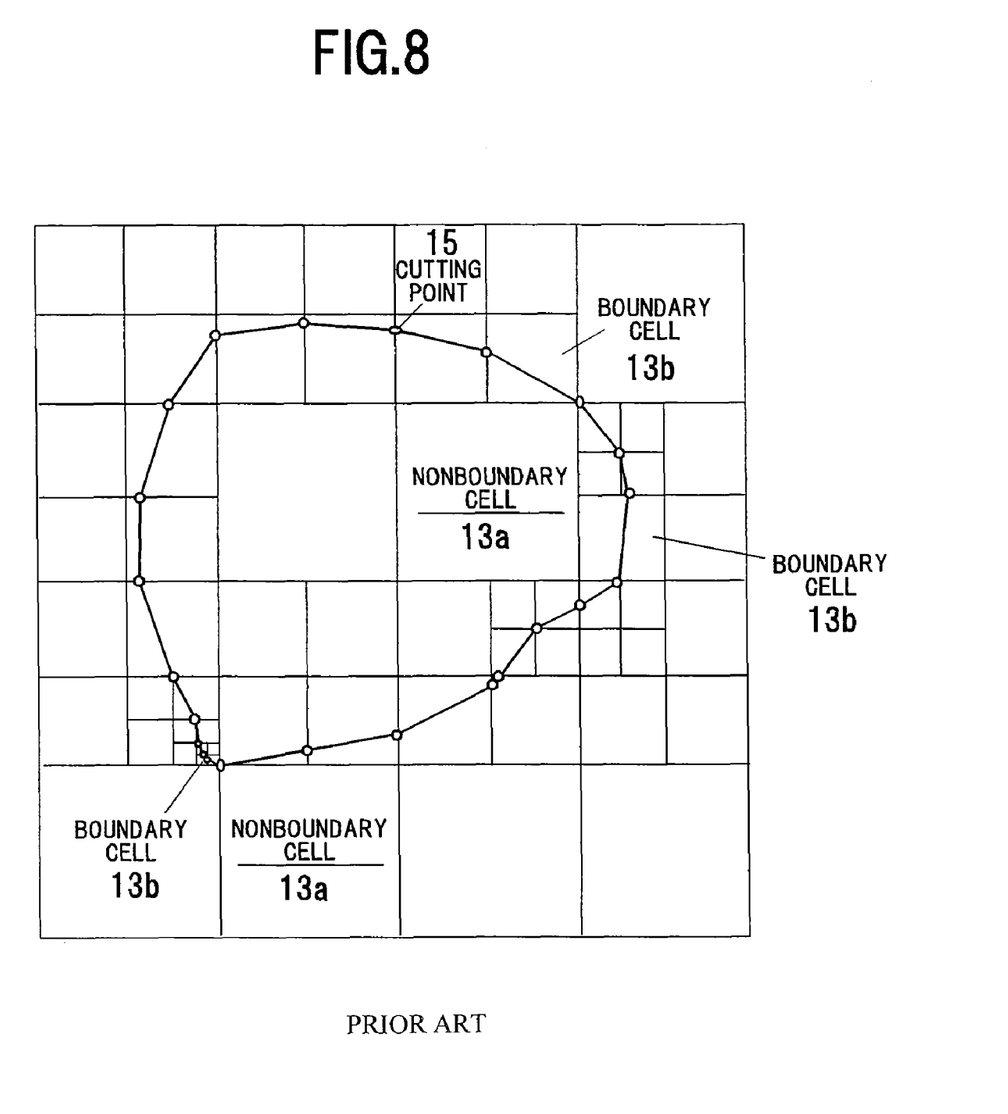
FIG. 8 is a schematic diagram showing "the method for storing substantial data that includes shapes and physical properties" in the Patent Document 1.

According to this invention, as schematically shown in FIG. 8, external data composed of boundary data of an object is divided into rectangular parallelepiped cells whose boundary surfaces cross each other by octree division, and the cells are classified into nonboundary cells $13a$ located inside or outside the object and boundary cells $13b$ each containing a boundary surface. In this figure, a reference numeral 15 denotes a cutting point.

According to this invention, substantial data that includes shapes and physical properties can be stored in a unified manner by storing various physical property values for each cell. Thus, a shape, structure, physical property information, and hysteresis of an object can be managed in a unified manner to enable management of data on a series of processes from designing to fabricating, assembling, testing, evaluation and the like based on the same data, whereby it is possible to unify CAD and simulation.

Hereinafter, in the present application, the rectangular parallelepiped cell whose boundary surfaces cross each other is referred to as "volume cell," data for which various physical property values are stored for each cell is referred to as "volume data," and simulation means with the volume data is referred to as "volume CAD" or "VCAD."

Moreover, the present inventor et al. suggest Patent Documents 2 to 4 as means for generating volume data from boundary representation data.

Moreover, Patent Document 5 and Non-patent Documents 1 to 6 have been disclosed as conventional technologies related to the present invention.

The method in the Patent Document 2 includes an octree division step, a cell classification step, a cutting point deciding step, and a boundary surface deciding step. Particularly, cells are classified as a different type of boundary cells according to the number of cutting points, the combination of edges to be cut is previously set for each boundary cell type, and the boundary cell type and the combination are acquired by pattern matching based on the acquired number of cutting points and the cut edges.

The method in the Patent Document 3 includes a division step, a cutting point deciding step, a boundary deciding step, a cell classification step, and a boundary cell data classification step. Particularly, in the three-dimensional cell, in the cutting point deciding step, intersection point patterns of boundary data and cell edges that have totally $2^{12}=4096$ arrangement cases are decided as the cell edge cutting points, and the arrangement cases that become equivalence classes by rotational operation and mirroring operation are decided as identical patterns so that the $2^{12}=4096$ arrangement cases are further classified into 144 patterns.

The method in the Patent Document 4 includes inputting boundary representation data of an object into a computer using external data input means, converting the boundary representation data to triangular patches with topology using data conversion means, dividing a space into rectangular parallelepiped cells whose boundary surfaces cross each other and associating cells with triangles included therein using association means, dividing the triangular patches with topology that appeared in the space by cell surfaces using division and arrangement means so that all triangles are arranged inside the cells or on the boundaries, integrating edges not to be changed in topology using edge integration means, assigning the respective triangles and their vertices to the cells with reference to index data of the vertices using cell assignment means, and setting attribute values of the cells using labeling means.

[Patent Document 1]
Japanese Patent No. 3468464, "Method for Storing Substantial Data that includes Shapes and Physical Properties"

[Patent Document 2]
International Publication No. WO 03/048980, "Method and Program for Converting Three-Dimensional Shape Data into Cell Internal Data"

[Patent Document 3]
International Publication No. WO 03/073335, "Method and Program for Converting Boundary Data into Cell Inner Shape"

[Patent Document 4]
Japanese Laid-Open Patent Publication No. 2005-38219, "Method and Program for Generating Volume Data from Boundary Representation Data"

[Patent Document 5]
Japanese Laid-Open Patent Publication No. 2003-44528, "Method for Generating Surface Grid of Object"

[Non-Patent Document 1]
H. Hoppe, "Progressive meshes," Proc. SIGGRAPH '96, pp. 99-108, August 1996

[Non-Patent Document 2]
W. J. Shroeder, "A Topology Modifying Progressive Decimation Algorithm," Proc. Visualization '97, pp. 205-212, October 1997

[Non-Patent Document 3]
W. J. Shroeder, J. A. Zarge and W. E. Lorensen, "Decimation of Triangle Meshes," Proc. SIGGRAPH '92, pp. 65-70, July 1992

[Non-Patent Document 4]
K. J. Renze and J. H. Oliver, "Generalized Surface and Volume Decimation for Unstructured Tessellated Domains," Proc. VRAIS '96, pp. 111-121, March 1996

[Non-Patent Document 5]
K. Kase, et al., "volume CAD," Volume Graphics (2003)

[Non-Patent Document 6]
Piegl L., Richard M., "Tessellating Trimmed NURBS Surfaces," Computer-Aided Design, 1995; 27(1): 16-26

The method for generating a shape representation with cells and rectangular patches adapted to the cells and data therefor, which have been suggested in the Patent Documents 2 and 3, is performed in the following steps:

(Step 1) calculating intersection points between a cell space defined by a user and a rectangular patch as an input shape (calculating cell cutting points);

(Step 2) generating a closed loop formed by connecting the cell cutting points on a cell surface for each cell (on this occasion, the cell cutting points are determined in the order in which the cutting points are uniquely determined based on the number of cell cutting points in the cell or the relation with the neighboring cells); and (Step 3) carrying out triangulation based on a difference from the input shape within the closed loop generated in each cell.

This method, however, has the following problems.

(1) There is a case where the processing of (Step 2) is not completed for a shape having the same level of complexity as the cell size of the volume cell.

(2) There is a case where the processing of (Step 2) is unsuccessful because a non-manifold shape appears in the process of gradually changing from a smaller shape than the cell size to a large shape.

(3) In view of considering that the cells are hierarchized, it is extremely difficult to retrieve the adjacency relation in the processing of (Step 2).

To resolve these problems, the Patent Document 4 describes means for directly using topology information of a rectangular patch of an input shape and simplifying the shape, if necessary, and the means includes:

(Step 1) converting an original surface patch (boundary representation data) to a triangular patch with topology;

(Step 2) dividing the triangular patch with topology into cell surfaces (rectangular parallelepiped cells whose boundary surfaces cross each other);

(Step 3) integrating vertices not on the cell edges among the vertices of the triangular patch with topology into other vertices; and (Step 4) carrying out optimization by approximating a portion contrary to the condition of Step 3 or to the basic condition of the volume data, "only one cutting point per edge of the rectangular parallelepiped cell."

The above means enables robust calculation according to the geometric shape to be input.

On the other hand, however, this means has a problem of high load on calculation for representing a complicated shape, which leads to a limitation on a single personal computer (PC) to deal with massive data. Therefore, there has been a demand for processing means whose load on calculation is relatively low.

There has already been suggested a method for dividing a rectangular patch into portions each having almost the same size as the cell size so as to be managed by cells [Patent Document 5]. In this method, however, the rectangular patch does not adapt to the cell and one-to-one management cannot be provided for the cell and the rectangular patch. Therefore, it is not applicable to a unified data management from upstream to downstream processes in manufacturing, which is the purpose of VCAD.

Furthermore, regarding the processing using a triangular patch alone, a method for carrying out detailed or simplified shape representation by subdividing or integrating triangular patches has already been suggested by Hoppe et al. [Non-patent Document 1], and various derived systems exist according to a subdividing parameter or a subdividing method or according to the decision criterion for integration.

These systems, however, adopt a conversion method with the two-manifold condition and topology condition inherited directly from those of the original shape. Therefore, they are unsuitable for operations of intentionally simplifying a minute shape or performing non-manifold representation of a surface having branches or edges [Non-patent Documents 2, 3, and 4].

SUMMARY OF THE INVENTION

The present invention has been provided to resolve the above problems. Therefore, it is an object of the present invention to provide a method and program for robustly and reliably converting boundary data of an object by using a computer into cell inner shape data in a cell complex, which is composed of rectangular parallelepiped cells each having boundary surfaces crossing each other without gaps between the rectangular parallelepiped cells, without need for dealing with massive data, thereby reducing load on calculation.

According to the present invention, there is provided a method for inputting boundary data of an object to a computer by external data input means, and converting the boundary data by using the computer into cell inner shape data in a cell complex composed of rectangular parallelepiped cells without gaps between the rectangular parallelepiped cells each having boundary surfaces perpendicular to each other, the method comprising:

a cutting point calculation step of defining the cell complex that contains the boundary data, and calculating a cutting point where the boundary data cuts an edge or vertex of the rectangular parallelepiped cell of the cell complex;

a cycle formation step of classifying the rectangular parallelepiped cells into a boundary cell having the cutting point and a nonboundary cell having no cutting point, acquiring a cutting segment between a cell surface and boundary data for each boundary cell, and forming a cutting segment cycle closed by connecting the cutting points and the cutting segments alternately in sequence;

a cycle internal division step of dividing the inside of the cutting segment cycle into cycle inner triangles sharing an adjacent side, for each boundary cell; and a simplification step of unifying a plurality of cutting points on each edge, and registering the cycle inner triangles in the cell, for each boundary cell.

According to one aspect of the present invention, locations of the cutting points are discretized positions that equally divide a length of a cell edge by $2^n$ (n is 2 or a greater integer).

The method further comprises a boundary data division step of dividing the boundary data of the object into boundary triangles sharing an adjacent side, before the cutting point calculation step.

For each boundary cell, the cycle formation step performs the steps of:

(1) extracting a cell edge;

(2) calculating a surface intersection point between a side of the boundary triangle of the boundary data and a cell surface;

(3) calculating an edge intersection point between a face of the boundary triangle and a cell edge;

(4) acquiring continuous cutting segments by connecting two or more of the surface intersection point and the edge intersection point on the same cell surface and on the same boundary triangle in order of proximity;

(5) acquiring a single cutting segment connecting the edge intersection points located at both ends of the continuous cutting segments by deleting the surface intersection points on the same cell surface; and (6) sequentially connecting the cutting segments on the cell surfaces via the edge intersection points to form the closed cutting segment cycle.

For each boundary cell, the simplification step performs the steps of:

(1) if a plurality of cutting points on the same cell edge, unifying the plurality of cutting points into the single cutting point closest to an origin;

(2) if the unified cutting points are in the same cycle inner triangle, collapsing the cutting triangle; and (3) if the unified cutting points are in different cycle inner cutting triangles, merging each pair of cycle inner cutting triangles within the boundary cell one by one until no more pair of cycle inner cutting triangles is included in the boundary cell.

Furthermore, according to the present invention, there is provided a program for inputting boundary data of an object to a computer by external data input means, and converting the boundary data by using the computer into cell inner shape data in a cell complex composed of rectangular parallelepiped cells each having boundary surfaces crossing each other without gaps between the rectangular parallelepiped cells, the method comprising:

a cutting point calculation step of defining the cell complex that contains the boundary data, and calculating a cutting point where the boundary data cuts an edge or vertex of the rectangular parallelepiped cell of the cell complex;

a cycle formation step of classifying the rectangular parallelepiped cells into a boundary cell having the cutting point and a nonboundary cell having no cutting point, acquiring a cutting segment between a cell surface and boundary data for each boundary cell, and forming a cutting segment cycle closed by connecting the cutting points and the cutting segments alternately in sequence;

a cycle internal division step of dividing the inside of the cutting segment cycle into cycle inner triangles sharing an adjacent side, for each boundary cell; and a simplification step of unifying a plurality of cutting points on each edge and registering the cycle inner triangles in the cell, for each boundary cell.

According to the above method and program of the present invention, the cutting point calculation step includes calculating the cutting point where the boundary data cuts the edge or vertex of the rectangular parallelepiped cell. Therefore, all cutting points can be acquired robustly and reliably.

Furthermore, the cycle formation step includes acquiring the cutting segment between the cell surface and the boundary data and forming the closed cutting segment cycle by connecting the cutting points and the cutting segments alternately in sequence. Therefore, the cutting segment cycle can be formed robustly and reliably.

Still further, the cycle internal division step includes dividing the inside of the cutting segment cycle into the cycle inner triangles sharing the adjacent side. Therefore, the cycle inner triangles can be formed robustly and reliably.

In addition, the simplification step includes unifying the plurality of cutting points on each edge into a single cutting point and registering the cycle inner triangles in the cell. Therefore, the entire data and thus load on calculation can be reduced.

Furthermore, the cycle formation step, the cycle internal division step, and the simplification step are executed for each boundary cell. Therefore, there is no need to deal with massive data so as to reduce load on calculation.

Other objects and advantages of the present invention will become apparent from the following description of embodiments with reference to the accompanying drawings.

DESCRIPTION OF THE PREFERRED EMBODIMENT

Hereinafter, the preferred embodiments of the present invention will be described by referring to the accompanying drawings.

1. Apparatus Configuration

Figure 1:
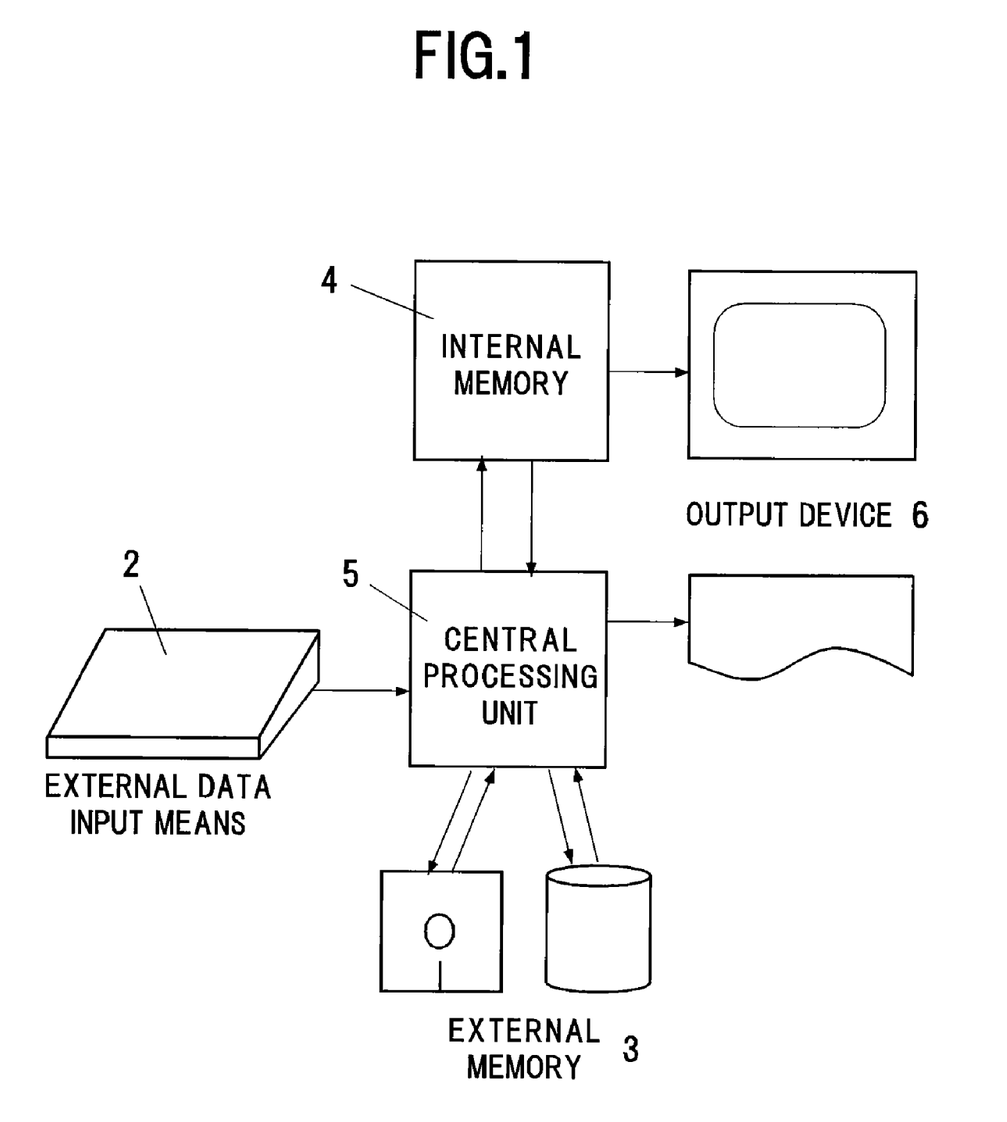
FIG. 1 is an apparatus configuration diagram for executing a method of the present invention.

Referring to FIG. 1, there is shown an apparatus configuration diagram for executing a method of the present invention. As shown in this diagram, the apparatus includes external data input means 2, an external memory 3, an internal memory 4, a central processing unit 5, and output devices 6.

The external data input means 2 is, for example, a keyboard, for use in inputting external data composed of boundary representation data of an object. The external memory 3 is a hard disk, a flexible disk, a magnetic tape, a compact disk, or the like and stores boundary data and cell inner shape data of an object and a conversion program therefor. The internal memory 4 is, for example, a RAM, ROM, or the like and stores arithmetic information. The central processing unit 5 (CPU) intensively processes arithmetic operation, input/output, and the like and executes a program in association with the internal memory 4. The output devices 6 are, for example, a display device and a printer and output the stored cell inner shape data and a result of executing the program.

The central processing unit 5, the internal memory 4, and the external memory 3 operate as boundary data division means, cutting point calculation means, cycle formation means, cycle internal division means, and simplification means, which will be described later, in association with each other.

External data input from the outside is polygon data representing a polyhedron, a tetrahedral or hexahedral element for use in a finite element method, curved surface data for use in three-dimensional CAD or a CG tool, or data representing some other solid surface by information containing a partial plane or curved surface.

In addition to such data (referred to as S-CAD data), the external data may be (1) data directly prepared by a human input through a VCAD-specific interface (V-interface), (2) surface digitized data of a measuring device, a sensor, a digitizer or the like, or (3) volume data containing internal information such as voxel data, which is used for CT scanning, MRI, and generally for volume rendering.

2. Method of the Present Invention

Figure 2:
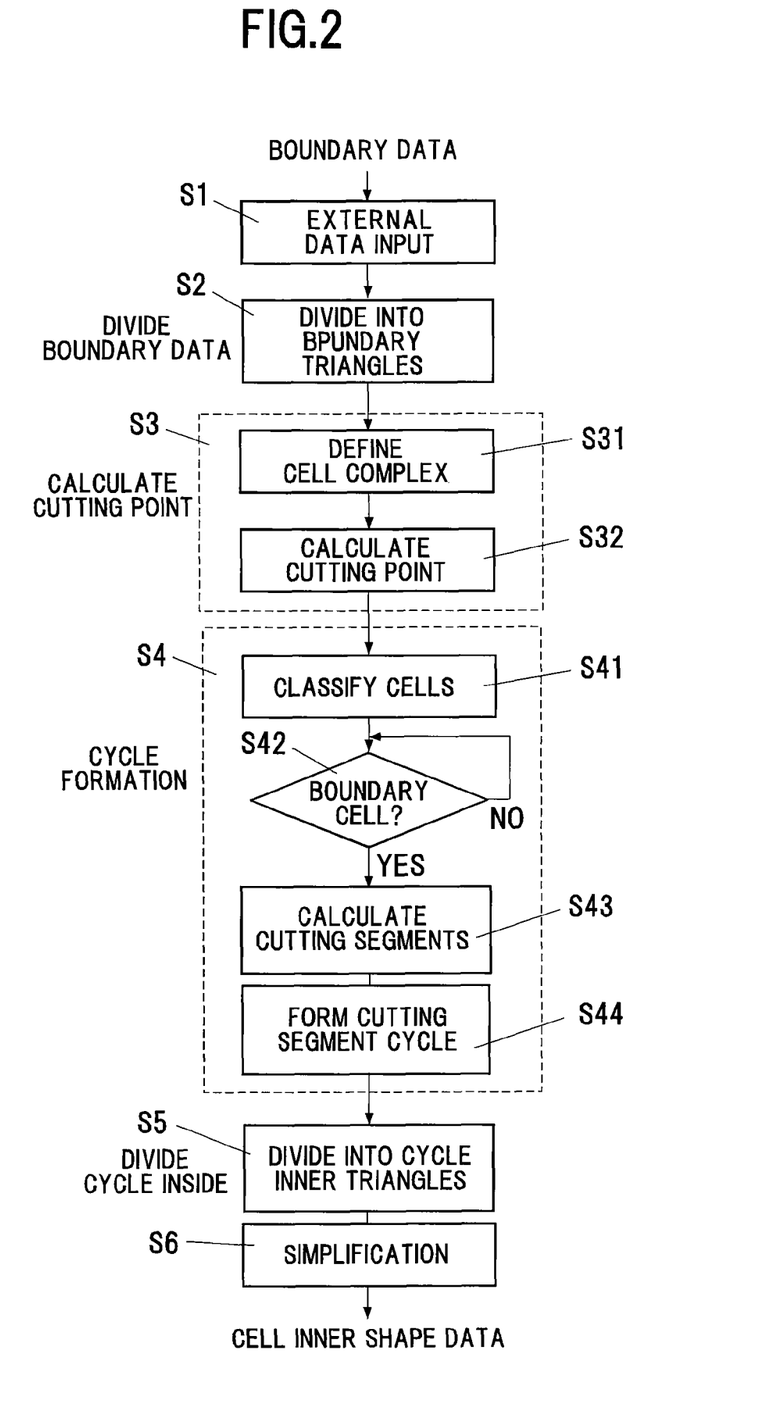
FIG. 2 is a flowchart showing the method of the present invention.

Referring to FIG. 2, there is shown a flowchart illustrating a method of the present invention. In the method of the present invention, the external data input means inputs boundary data of an object to a computer and the computer is used to convert the boundary data into cell inner shape data in a cell complex, which is composed of rectangular parallelepiped cells each having boundary surfaces crossing each other without gaps between the rectangular parallelepiped cells.

In FIG. 2, the method of the present invention includes an external data input step S1, a boundary data division step S2, a cutting point calculation step S3, a cycle formation step S4, a cycle internal division step S5, and simplification step S6.

In the external data input step S1, the boundary data of the object is input to the computer by using the external data input means.

In the boundary data division step S2, the boundary data of the object is divided into boundary triangles sharing an adjacent side. This step is not indispensable, but the use of triangle patches reduces the data amount and lowering the load on calculation in each step.

In the cutting point calculation step S3, the cell complex containing the boundary data is defined in step S31 and a calculation is made for a cutting point where the boundary data cuts the edge or vertex of a rectangular parallelepiped cell of the cell complex in step S32.

Preferably, the locations of the cutting points are discretized positions that equally divide the length of a cell edge by a $2^n$ (n is 2 or a greater integer) to enhance the robustness of data.

In the cycle formation step S4, the rectangular parallelepiped cells are classified into boundary cells each having a cutting point and nonboundary cells each having no cutting point in step S41, a cutting segment between a cell surface and boundary data is acquired in step S43 for each boundary cell (step S42), and a closed cutting segment cycle is formed by connecting the cutting points and the cutting segments alternately in sequence in step S44.

Figure 3:
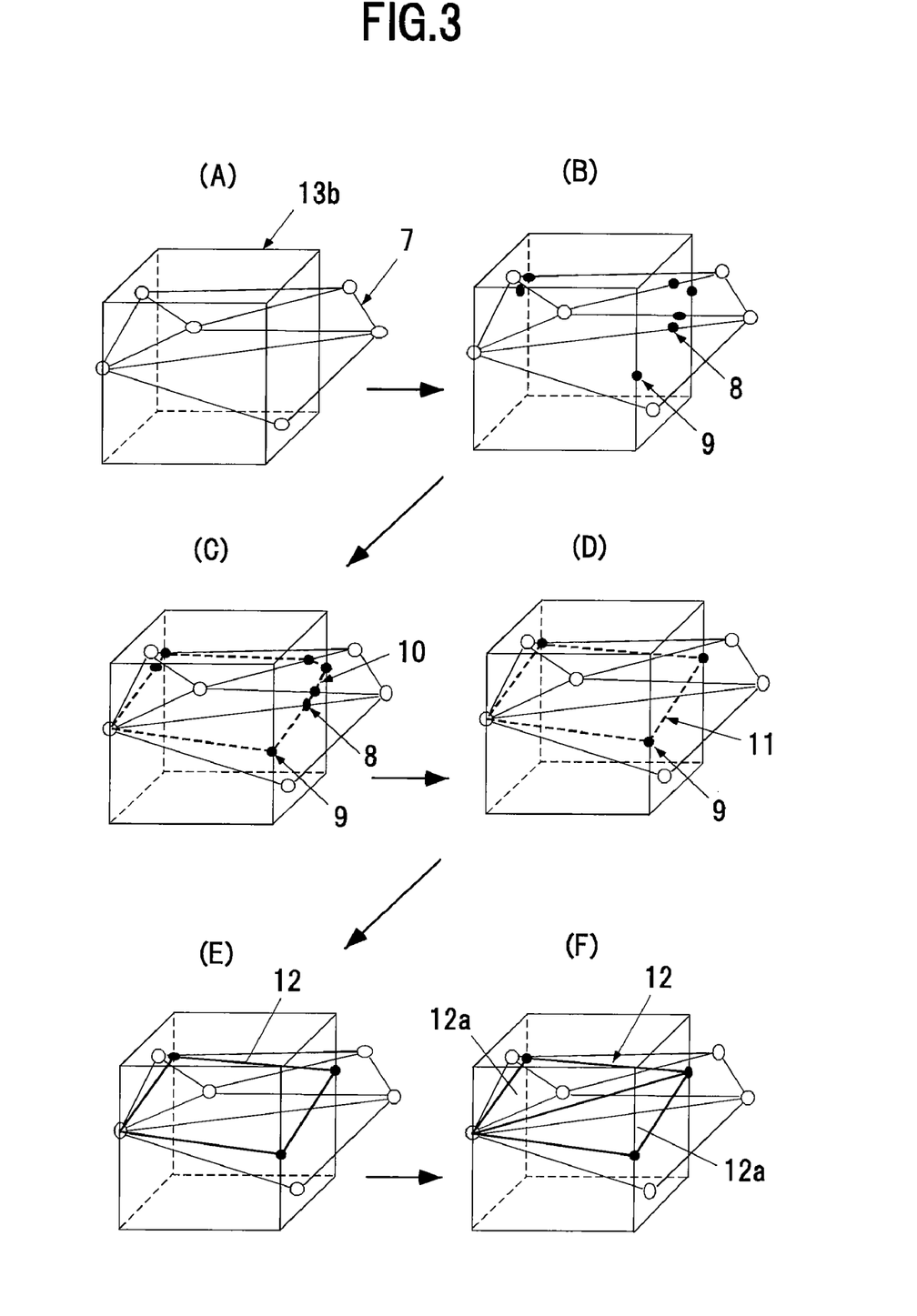
FIG. 3 is an explanatory diagram for a cycle formation and a cycle internal division.

Referring to FIG. 3, there is shown an explanatory diagram for the cycle formation step S4 and the cycle internal division step S5. At (A) of FIG. 3, the rectangular parallelepiped cell indicated by thin lines is a boundary cell 13b, a plane formed by connecting white circles via thin lines represents boundary triangles 7 constituting boundary data.

In the cycle formation step S4, the following (1) to (6) steps are performed in order for each boundary cell.

(1) First, cell edges of the boundary cell 13b are extracted. The cell edge extraction is completed only by extracting 12 sides in the case of a single-level hierarchy. For a case of "a transit cell" having a level difference from a neighboring cell, all of the edges on the surfaces of the cell concerned and on the edges of the cell concerned are extracted from the edges of the cell concerned and the edges of the neighboring cell, leaving only shorter ones regarding overlapping edges.

(2) Then, as shown at (B) of FIG. 3, each surface intersection point 8 (black circle) between the side of the boundary triangle 7 of the boundary data and the cell surface is calculated.

(3) Subsequently, as shown at (B) of FIG. 3, each edge intersection point 9 (black circle) between the surface of the boundary triangle 7 and the cell edge is calculated.

(4) Subsequently, as shown at (C) of FIG. 3, continuous cutting segments 10 are acquired by connecting two or more of the surface intersection points 8 and the edge intersection points 9 on the same cell surface and the same boundary triangle in order of proximity.

(5) Thereafter, as shown at (D) of FIG. 3, a single cutting segment 11 connecting the edge intersection points 9 located at both ends of the continuous cutting segments 10 is acquired by deleting the surface intersection points 8 on the same cell surface.

(6) Subsequently, as shown at (E) of FIG. 3, the cutting segments 11 on the cell surfaces are sequentially connected via the edge intersection points 9 to form a closed cutting segment cycle 12.

In the cycle internal division step S5, as shown at (F) of FIG. 3, the inside of the cutting segment cycle is divided into cycle inner triangles 12a sharing an adjacent side.

In the simplification step S6, a plurality of cutting points on each edge are unified into a single point and the cycle inner triangles are registered in the cell, for each boundary cell.

The following processes are performed in the simplification step S6 for each boundary cell.

(1) If a plurality of cutting points exist on the same cell edge, a plurality of cutting points on the same cell edge are unified into the single cutting point closest to the origin.

(2) If the unified cutting points are in the same cycle inner triangle, the cutting triangle is collapsed.

(3) If the unified cutting points are in different cycle inner cutting triangles, each pair of cycle inner cutting triangles within the boundary cell are merged one by one until no more pair of cycle inner cutting triangles is included in the boundary cell.

The conversion program of the present invention is a computer program for executing the above step S1 to step S6 and the program is installed on a computer when it is used.

Hereinafter, the present invention will be described in more detail.

3. Representation of Volume (Three-Dimensional Region) and Boundaries by CW-Complexes (Cell Complexes)

Section 3.1 defines a CW-complex and related terms. Section 3.2 introduces a new data structure of a rectangular parallelepiped cell based on CW-complex (it is referred to as "volume cell" or "Kitta Cube").

3.1 Cells and CW-Complexes (Cell Complexes)

"n-cell" is a mathematical term in the algebraic topology. A "0-cell" is a vertex, "1-cell" is an open line segment, which is bounded by two "0-cells" at both ends, a "2-cell" is an open surface, which is bounded by a loop of three or more "1-cells," and a "3-cell" is a three-dimensional region (it is referred to as "volume") enclosed by a curved surface made of "2-cells."

More exact definitions of "n-cells" and cell complexes are as described below.

A Hausdorff space X is referred to as a "cell complex" if continuous maps of the open balls (discs) $B^n_\alpha$ satisfies the conditions of an equation (1) in various dimensions (whose images, or strictly speaking, the maps themselves are referred to as cells, in n-dimensional case, n-cells) and each of the maps is a one-to-one map inside an n-dimensional ball.

$$(i) \quad X = \bigcup_{\lambda \in \Lambda} e_\lambda \qquad (1)$$

$$(ii) \quad e_\lambda \cap e_\mu = \phi \quad (\lambda \neq \mu)$$

$$(iii) \quad \text{if } dim(e_\lambda) = n \text{ then } \partial e_\lambda \subset X^{n-1}$$

$$X^n = \bigcup_{dim(e_\mu) \leq n} e_\mu \qquad (2)$$

$$\partial e = \bar{e} - e$$

In the equation (1), $\dim(e_\lambda)$ denotes the dimension of cell $e_\lambda$ and has the relation of the equation (2), where $\bar{e}$ having an upper line is the closure of e.

(i) of the equation (1) means that the sum of the cells equals X. (ii) means that cells are piecewise disjoint, and (iii) means that, for each n, the boundary of the n-cell lies in the sum of the cells whose dimensions are less than n.

In the present invention, the CW-complexes (cell complexes) are cell complexes, which satisfy the equation (1) and satisfy C and W conditions described below.

C is an initial character as an abbreviation of a closure finite. The C condition is that an arbitrary point is always included in one of the concrete elements (for example, a vertex, an edge, a face, or the like) of a finite subset of cell complexes. This condition theoretically guarantees that any integration on any region of the cell complexes does not diverge, indicating possibility of infinite improvement of numerical analysis.

Meanwhile, W is an initial character as an abbreviation of a weak topology. The W condition is that global and topological features, such as whether an object or its surrounding environment is an open set or a closed set, can be determined by local interaction with cell complexes. This condition also guarantees that each element of cell complexes is a module of the whole system and various distributed/parallel approaches are effective.

Both conditions are necessary for the future developments such as grid computing to deal with mass data and realistic engineering analysis.

CW-complexes (cell complexes) are, in other words, combinational structures without omission or overlapping of topological elements such as vertices, edges, faces and the like. They can also naturally represent a plurality of three-dimensional regions (volumes), separated by surfaces or boundaries. This is an excellent advantage for handling multiple-materials and is indispensable to cell labeling. For example, there are voxels or FEM (finite element method) meshes as examples of CW-complexes.

3.2 Kitta Cubes (Volume Cell)

A Kitta Cube is a rectangular parallelepiped (cell) having approximate triangles (referred to as "cutting triangles"). Vertices of the cutting triangles lie on the edges of the rectangular parallelepiped cell and the number of vertices of the triangles on any edge is at most one. Each side of the cutting triangles is referred to as a cutting segment.

In the present invention, a set of Kitta Cubes (volume cells) is the core data structure of VCAD, and a realistic implementation of CW-complex is achieved with the following additional conditions from the viewpoint of practical use:

(1) "Uniformity condition": A VCAD three-dimensional object (world) is defined as a set of L×M×N voxels. The number of voxels is specified by a user and thus the final resolution is automatically determined. The determination of the number of voxels requires caution and experiences in conformity to a model. Each voxel is referred to as a base voxel.

(2) "Multiple-resolution condition": Hierarchy is given to each base voxel as an octree, where each octant (3-cell=three-dimensional region) shares subdivided faces (2-cell=open curved surface) between neighboring octants with different level (See FIG. 5. this arrangement is not acceptable in an Euclidean cell complex, but causes no problem for a CW-complex).

(3) "Expressiveness condition": In addition to the usual eight-subdivision of octree, each leaf (terminal) octant can be subdivided by several new additional faces (also considered as 2-cells), which follows "one cutting point per edge or vertex" rule (referred to as "one cutting point per edge rule"). Note that, however, the cutting point is disposed at an arbitrary location of the edge or vertex so that these additional faces approximate the original boundary surfaces sufficiently at that resolution.

Figure 4:
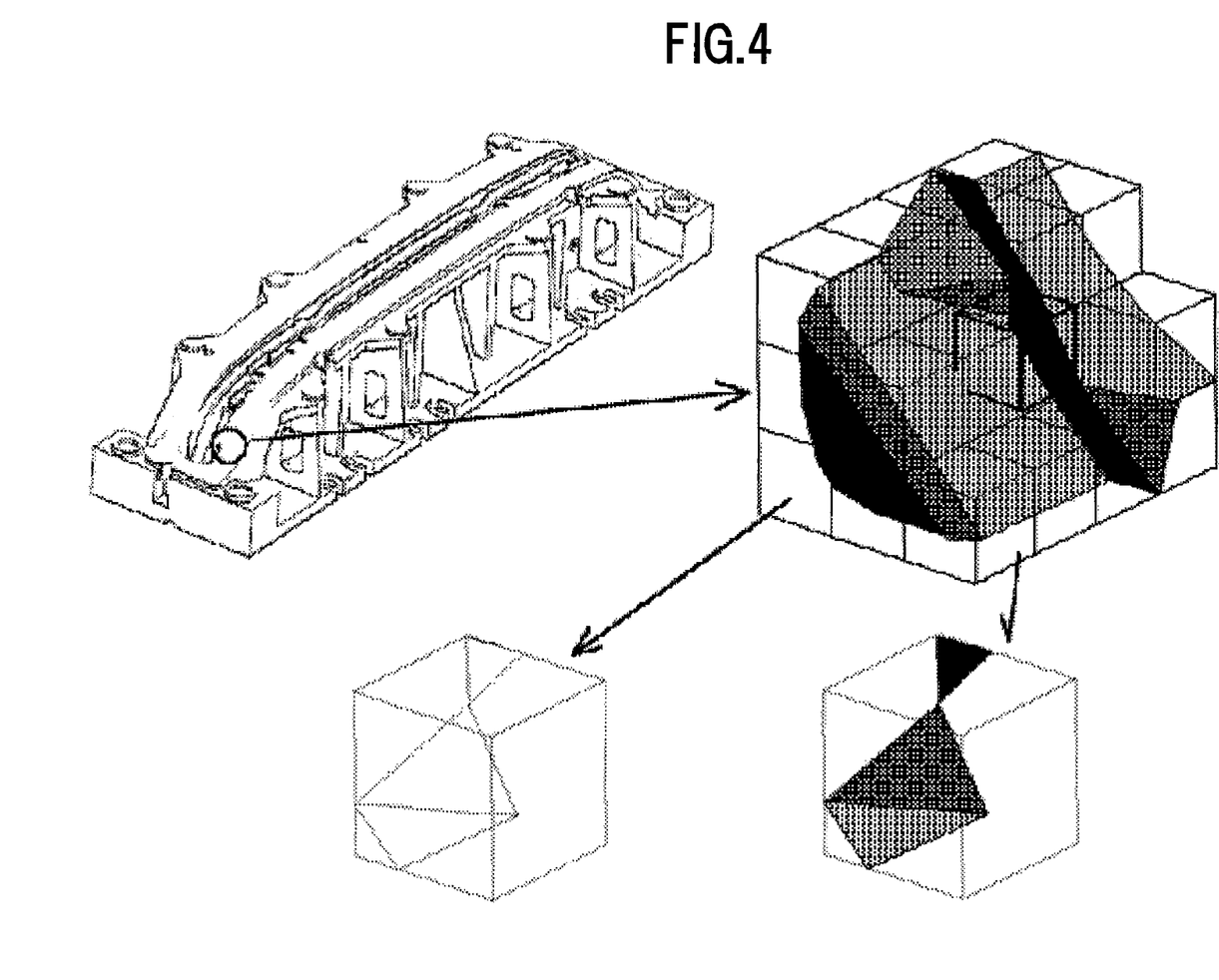
FIG. 4 is a diagram showing an example of Kitta Cubes.

Referring to FIG. 4, there is shown a diagram illustrating an example of Kitta Cubes. In this diagram, the top left figure illustrates a press die, which has been obtained from Tsubamex Co., Ltd. and translated from IGES to VCAD of 64×256×64 base voxels, showing only solid part cubes. The remaining figures show a unique configuration of Kitta Cubes, which will be never seen in Marching Cubes. Points are cutting points. Surfaces are partition faces composed of cutting triangles. In the bottom right figure, cutting points are moved to the midpoint of the edges to show the configuration clearly.

As shown in FIG. 4, the cutting point can be considered as a subdivision point (0-cell) in the edge (1-cell) or on its two boundary vertices (0-cell) of the leaf octant to represent the new additional face (referred to as "partition face" and defined as a set of connected cutting triangles in a rectangular parallelepiped cell). Consequently, all faces (2-cells) including partition faces and subdivided faces on faces constituting the rectangular parallelepiped cell are categorized to non-manifold (not two-manifold) surfaces, that is, every edge (1-cell) is adjacent to two or more faces (2-cells) (branching).

(4) "Robustness condition": All cutting point locations are discretized to positions that equally divide the length of an edge of the base voxel by $2^n$, to avoid accumulation of numerical errors and gaps between topological and geometrical information due to round off error. Each partition face is triangulated (simplicially subdivided) using cutting points. Therefore, the orientations of Kitta Cube triangles are also discretized.

The "uniformity condition" was introduced for ease of global positioning in any computation process. Any base voxel that contains no leaf octant or octree is a Kitta Cube.

Figure 5:
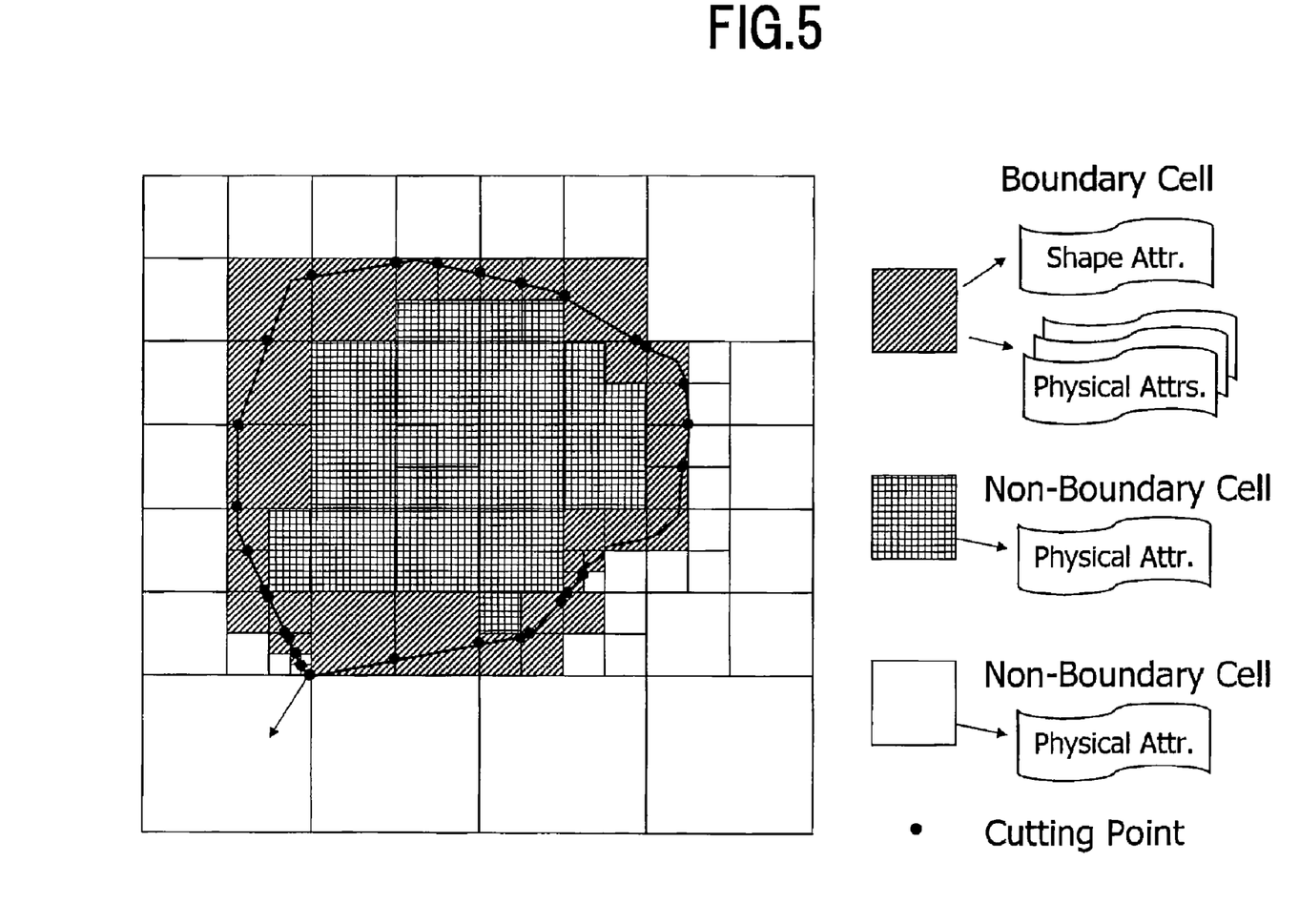
FIG. 5 is a diagram showing an example of Kitta Cubes starting from one base voxel in the two dimensional case.

Referring to FIG. 5, there is shown an example of Kitta Cubes starting from one base voxel in the two dimensional case. In this example, the object (world) is in two dimension (quad tree, one base voxel L=M=1).

As shown in this diagram, Kitta Cubes can be classified into two types according to the existence of cutting points: we call Kitta Cube with cutting points "boundary cell" and Kitta Cube without cutting points "non-boundary cell."

Figure 6:
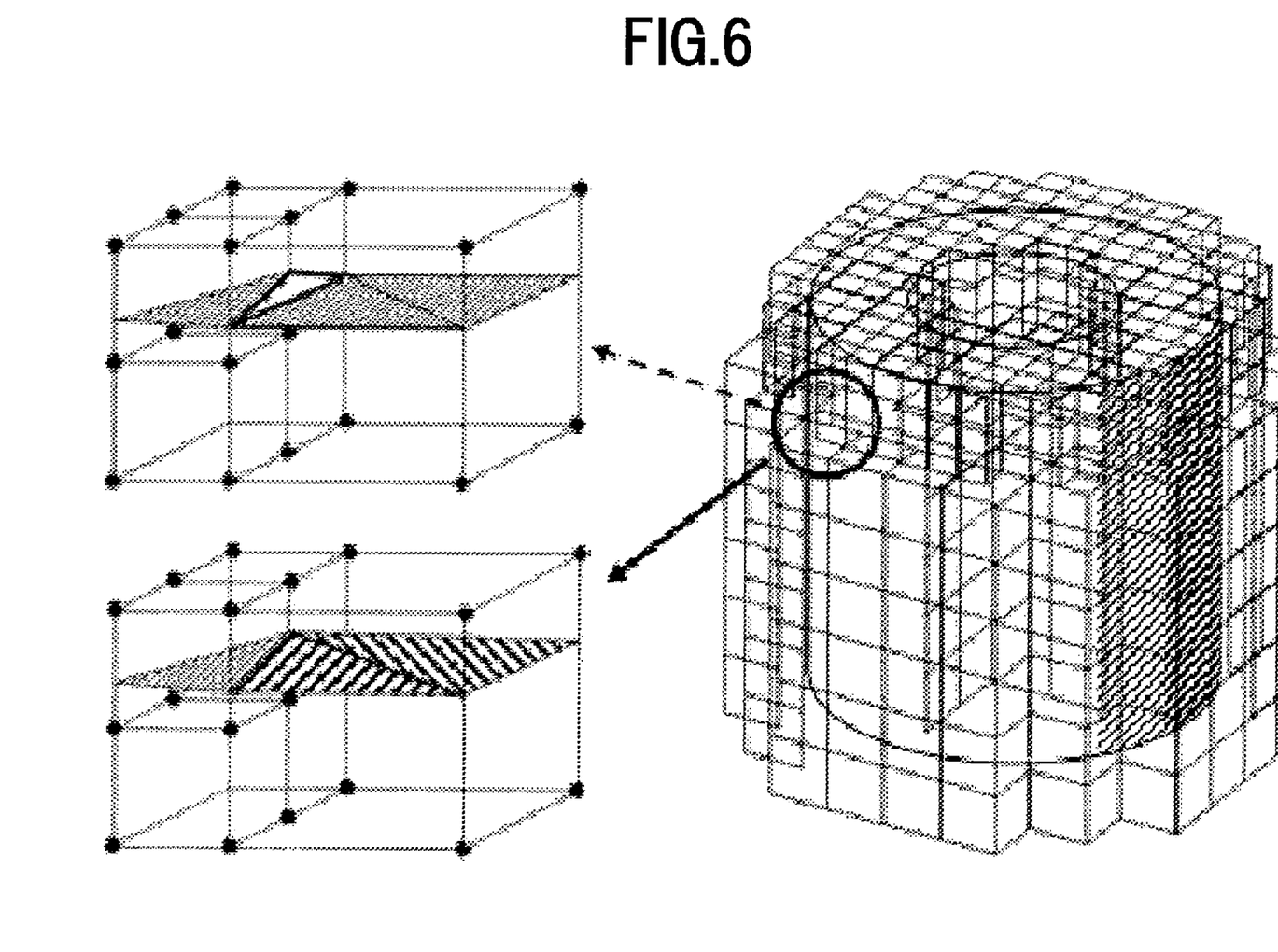
FIG. 6 is a diagram showing an example of Kitta Cubes of different levels in hierarchy.

Referring to FIG. 6, there is shown an example of Kitta Cubes of different levels. In this diagram, the top left figure shows a case where a "gap" is generated by following the "one cutting point per edge rule" (the rule of one cutting point per edge or vertex). To fill the gap, a new "transit cell" is introduced to the bigger cell as shown in the bottom left figure. The right figure shows a case where the configuration has a level difference of two, with the respective points denoting cutting points.

In the "expressiveness condition," the "one cutting point per edge rule" is adopted as a standard of subdivision in the multi-resolution condition. However, when this rule is strictly followed, gaps on faces or edges occur between cells having different levels as shown in the top left of FIG. 6 just like the dual methods. To resolve this problem, the bigger cell shares all faces, edges, vertices, and cutting points of several neighboring smaller cells following CW-complex formulation. Those exceptional cells as shown in the bottom left of FIG. 6 are referred to as "transit cells." Only transit cells do not follow the "one cutting point per edge or vertex" rule. Levels are not necessarily step by step, for example, more than one level difference is acceptable as shown in the right part of FIG. 6. These transit cells are used for two purposes: (1) to prevent a gap or holes between different levels and (2) to minimize the influence of level difference.

For the "robustness condition," when a Kitta Cube is subdivided m times according to the octree style (multi-resolution condition) from the base voxel, the number of cutting point locations on each edge is reduced to $2^{n-m}+1$, where n and m are each 1 or a greater integer and n–m is 1 or a greater integer. Therefore, neighboring cells with the difference levels of the hierarchy can share exactly the same digital cutting point locations.

FIG. 4 shows Kitta Cubes composed only of base voxels having no level difference. The top left of FIG. 6 shows one example of a Kitta Cube configuration. It shows that the cutting point arrangement, which can never be represented by Marching Cubes, can be represented by the Kitta Cubes for the first time due to its edge-based data structure of $2^{12}$ states greater than the vertex-based data structure of $2^8$ states of Marching Cubes.

Actually, these $2^{12}$ states include insignificant configurations such as only one cutting point in one cell. However, finding significant and effective configurations is very hard and an interesting problem in discrete mathematics. One solution for this problem, reducing redundancy by group theory approach has been reported separately by Teshima who is a coinventor.

The unique configuration of the Kitta Cubes shown in FIG. 4 can never be represented by the Marching Cube or other vertex-based cube methods, in which a cutting point cannot exist on edges whose end points have the same sign (the face side) or belonging space (material).

Though the dual method can also be used to represent a similar configuration for a purpose of representing multiple-materials situation, it allows a vertex (free point) to move freely in the cell, which is advantageous for the degree of expressiveness, but this can lead to assurance difficulties for the numerical accuracy of the location. Therefore, it is necessary to add discretization of each free point location in the cell to meet the robustness condition.

4. Surface Simplification by Kitta Cubes (Volume Cells)

A signed 1-cycle is defined as an ordered cyclic list (string) of neighboring cutting segments (1-cells=open line segments). An unassigned 1-cycle is defined as a pair of two signed 1-cycles, which face reverse directions mutually on both sides of a curved surface (the unsigned 1-cycle is a quotient group of signed 1-cycles).

This unsigned 1-cycle is used in algebraic translation into Kitta Cubes from the original curved surfaces as described in Sections 4.1 and 4.2. In the present invention, the unsigned 1-cycle is simply referred to as "cycle."

Kitta Cubes provide the merit of simplifying various computational algorithms due to no need to consider details inside the rectangular parallelepiped cell and also provide robustness by discrete and algebraic representation.

From the definition of CW-complexes (cell complexes), this translation process can be considered as an intersection calculation of a sphere $S^2$ (as a model of six faces of the rectangular parallelepiped cell) and a parametric surface P(u, v). The resulting lines of intersection are stored as unsigned 1-cycles (algebraic information, namely a character string) with fragmentary data (an intersection point between which a face of a cell and a boundary or trimming curve of the parametric surface, parameter values of the intersection point, and the like).

These unsigned 1-cycle (cycle) correspond to 2-cells (homeomorphic to the disc $D^2$ in clipped parts of the parametric surface P(u,v) by cells). The inside of the 1-cycle is filled with cell mappings, which are actually realized by the above fragmentary data (resulting parameter values recorded as a result of the intersection calculation).

More specifically, the 1-cycle represents only the frame of a goldfish scoop, while the fragmentary data serves as paper of the scoop in an actual calculation.

Through this unsigned 1-cycle substitution and triangulation process, local geometrical details such as a subtle change in curvatures, sharp edges, or corners are linearly approximated and cut off. If the boundary cell still includes a plurality of unsigned 1-cycles at any edge of the cell in this stage, those are merged to satisfy the "one cutting point per edge rule" (the rule of one cutting point per edge or vertex) of Kitta Cube.

For example, thin structures having thicknesses are cut off and simplified into a face or a crack in the surrounding region. This merging process will be described in detail in Section 4.2. The whole translation algorithm is described in Section 4.1.

4.1 Algorithm

This algorithm is a fully independent (autonomous and not related to others, namely computable in parallel) process in each rectangular parallelepiped cell. This simplification algorithm has been extended from the algorithm in [Non-patent Document 5].

4.1.1 Kitta Cube Translation Algorithm

For each boundary cell, the following Steps 1 to 4 are performed:

Step 1: Cutting point calculation (the intersection point is quantized as a cutting point and stored as an index (ordinal number) with fragmentary data (such as parameters u, v))

Step 2: Piecewise linear interpolation of an intersection point between a boundary cell surface and an input curved surfaces (unsigned 1-cycles stored with fragmentary data)

Step 3: Triangulation of unsigned 1-cycles (cutting triangles by simplicial decomposition are generated and stored)

Step 4: Unification of a plurality of cutting points per edge of the cell and cutting triangles registration into the cell (simplification)

In step 1, as cutting points, the intersection points between 12 edges of a boundary cell and the input original curved surfaces are calculated and their locations are discretized (quantized into a $2^m$ division of the length) in accordance with the "robustness condition" described in Section 3.2. New eight vertices of the boundary cell are added for the cutting point locations to the method described in [the Non-patent Document 5].

This expansion increases the number of possible unsigned 1-cycles in a combinational manner. Therefore, segmented curves, which are the lines of intersection between the original curved surface and each face of the cell, are calculated and linearly interpolated in step 2. This is actually done by checking the line of intersection connecting the cutting points therebetween on the u-v plane and linking only actually connected ones using the fragmentary data, and thereby, the segmented curves are calculated as cutting segments.

The resulting triangles of step 3 are cutting triangles. It is achieved by applying the Piegl's (Non-patent Document 6) triangulation method of the trimmed NURBS surfaces to this triangulation within an unsigned 1-cycle.

The simplification method in step 4 is described in Section 4.2 below.

After execution of this algorithm, isolated cutting points or dangling cutting segments, which are not recognized as unsigned 1-cycles, are left as they are. It is easy to efficiently search and remove them automatically by checking the vicinity of the boundary cell locally.

4.2 Unification of Cutting Points and Cutting Triangle Registration

In step 4 in Section 4.1, a plurality of cutting triangles are merged or collapsed by the unification of the plurality of cutting points on the same edge of the cell.

The following two operations for cutting triangles are sufficient for this surface simplification.

"Collapse": A cutting point, cutting segments connected to it, and a cutting triangle including it are removed by the unification of cutting points.

"Merge": Two cutting triangles are merged into a new connected partition face sharing a cutting segment (by the unification of cutting points). This operation sometimes generates branching partition faces, that is, non-manifold surfaces.

The simplification algorithm in step 4 is as follows.

For each edge of a boundary cell, the following (1) to (3) are performed:

(1) If a plurality of cutting points exist on the edge concerned, these cutting points are unified into the cutting point closest to the origin.

(2) If the unified cutting points are in the same cutting triangle, the collapse operation is performed (the cutting triangle is also collapsed).

(3) Otherwise (if the unified cutting points are in different cutting triangles), the following is performed.

For each pair of cutting triangles (within the boundary cell), the merge operation is performed until all pairs are complete.

Figure 7:
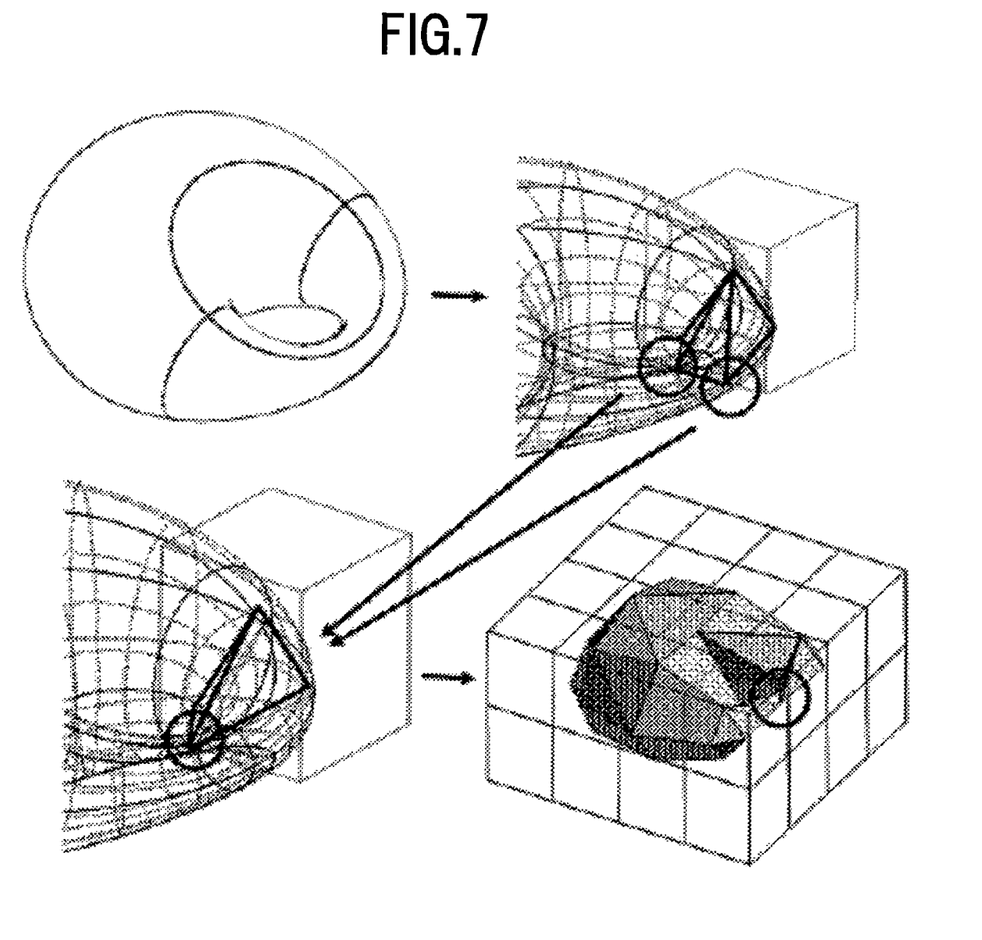
FIG. 7 is a diagram showing all steps of the Kitta Cube translation algorithm.

FIG. 7 shows all steps of the Kitta Cube translation algorithm in Section 4.1. This diagram shows a Kitta Cube translation: the top left figure shows an input curved surface (cyclide) and the top right figure shows the results of the cutting point calculation, the linear approximation into unsigned 1-cycles, and triangulation into cutting triangles (step 1 to step 3).

The bottom left figure shows that a cutting triangle is collapsed (circles and arrows) in step 4. The bottom right figure shows the resulting non-manifold (branching face at the point indicated by the circle) Kitta Cubes.

In this example, only the collapse operation is performed. The top left of FIG. 7 shows an input NURBS surface (cyclide). The top right of FIG. 7 shows the results of steps 1 to 3 performed at a single boundary cell. By step 1, two cutting points on one edge of the cell are calculated (the portions enclosed by circles in FIG. 7). An unsigned 1-cycle is piecewise linearly interpolated by connecting the corresponding cutting points in step 2 and is triangulated in step 3. These two cutting points and a cutting triangle including them are collapsed in step 4 as shown in the bottom left of FIG. 7. The bottom right of FIG. 7 shows the resulting non-manifold Kitta Cubes with branching (circle) at the point generated as a result.

According to the method and program of the present invention, a calculation is made for a cutting point where boundary data cuts the edge or vertex of a rectangular parallelepiped cell in the cutting point calculation step. Therefore, all cutting points can be obtained robustly and reliably.

Moreover, a cutting segment between a cell surface and boundary data is acquired to form a cutting segment cycle closed by connecting the cutting points and the cutting segments alternately in the cycle formation step. Therefore, the cutting segment cycle can be formed robustly and reliably.

Furthermore, the inside of the cutting segment cycle is divided into cycle inner triangles sharing an adjacent side in the cycle internal division step, whereby the cycle inner triangles can be formed robustly and reliably.

Moreover, a plurality of cutting points on each edge are unified into a single point and the cycle inner triangles are registered in the cell in the simplification step. Therefore, the whole data and load on calculation can be reduced.

Moreover, the cycle formation step, the cycle internal division step, and the simplification step are performed for each boundary cell. Therefore, there is no need to deal with massive data and load on calculation can be reduced.

It is to be understood that the present invention is not limited to the above embodiments and examples and various modifications or alterations may be made without departing from the scope of the present invention.

What is claimed is:

1. A method for inputting boundary data of an object to an apparatus comprising a computer operably coupled to receive boundary data from an external data input means, and converting the boundary data by using the computer into cell inner shape data in a cell complex comprising rectangular parallelepiped cells without gaps between the rectangular parallelepiped cells, wherein each rectangular parallelepiped cell has boundary surfaces perpendicular to each other, wherein the method comprises the steps of:

(a) using the external data input means of the apparatus to input boundary data of the object;

(b) using the computer to perform a cutting point calculation step that includes defining the cell complex that contains the boundary data, and calculating a cutting point where the boundary data cuts an edge or vertex of the rectangular parallelepiped cell of the cell complex;

(c) using the computer to perform a cycle formation step that includes classifying the rectangular parallelepiped cells into a boundary cell having the cutting point and a nonboundary cell having no cutting point, and acquiring a cutting segment between a cell surface and boundary data for each boundary cell, and forming a cutting segment cycle that is closed by connecting the cutting points and the cutting segments alternately in sequence;

(d) using the computer to perform a cycle internal division step that includes dividing an inside of the cutting segment cycle into cycle inner triangles sharing an adjacent side, for each boundary cell; and (e) using the computer to perform a simplification step that includes unifying a plurality of cutting points on each edge, and registering the cycle inner triangles in the cell, for each boundary cell.

2. A method according to claim 1, wherein locations of the cutting points are discretized positions that equally divide a length of a cell edge by $2^n$, wherein n is 2 or a greater integer.

3. A method according to claim 1, further comprising the step of:

(f) using the computer to perform a boundary data division step that includes dividing the boundary data of the object into boundary triangles sharing an adjacent side, before performing the cutting point calculation step.

4. A method according to claim 1, wherein, for each boundary cell, the simplification step further includes performing the steps of:

(1) if there are a plurality of cutting points on the same cell edge, then unifying the plurality of cutting points into the cutting point closest to an origin;

(2) if the unified cutting points are in the same cycle inner triangle, then collapsing the same cycle inner triangle; and (3) if the unified cutting points are in different cycle inner triangles, then merging each pair of the different cycle inner triangles within the boundary cell one by one until no more pairs of the different cycle inner triangles are included in the boundary cell.

5. A program stored in an internal memory of an apparatus, wherein the program executes a method for inputting boundary data of an object to the apparatus that includes a computer operably coupled to receive boundary data from an external data input means, and converting the boundary data by using the computer into cell inner shape data in a cell complex comprising rectangular parallelepiped cells, wherein each rectangular parallelepiped cell has boundary surfaces crossing each other without gaps between the rectangular parallelepiped cells, wherein the program causes the computer to execute the method comprising the steps of:

(a) defining the cell complex that contains the boundary data, and calculating a cutting point where the boundary data cuts an edge or vertex of the rectangular parallelepiped cell of the cell complex;

(b) classifying the rectangular parallelepiped cells into a boundary cell having the cutting point and a nonboundary cell having no cutting point, and acquiring a cutting segment between a cell surface and boundary data for each boundary cell, and forming a cutting segment cycle that is closed by connecting the cutting points and the cutting segments alternately in sequence;

(c) dividing an inside of the cutting segment cycle into cycle inner triangles sharing an adjacent side, for each boundary cell; and (d) unifying a plurality of cutting points on each edge and registering the cycle inner triangles in the cell, for each boundary cell.

6. A method for inputting boundary data of an object to an apparatus comprising a computer operably coupled to receive boundary data from an external data input means, and converting the boundary data by using the computer into cell inner shape data in a cell complex comprising rectangular parallelepiped cells without gaps between the rectangular parallelepiped cells, wherein each rectangular parallelepiped cell has boundary surfaces perpendicular to each other, wherein the method comprises the steps of:

(a) using the external data input means of the apparatus to input boundary data of the object;

(b) using the computer to perform a cutting point calculation step that includes defining the cell complex that contains the boundary data, and calculating a cutting point where the boundary data cuts an edge or vertex of the rectangular parallelepiped cell of the cell complex;

(c) using the computer to perform a cycle formation step that includes classifying the rectangular parallelepiped cells into a boundary cell having the cutting point and a nonboundary cell having no cutting point, and acquiring a cutting segment between a cell surface and boundary data for each boundary cell, and forming a cutting segment cycle that is closed by connecting the cutting points and the cutting segments alternately in sequence;

(d) using the computer to perform a cycle internal division step that includes dividing an inside of the cutting segment cycle into cycle inner triangles sharing an adjacent side, for each boundary cell;

(e) using the computer to perform a simplification step that includes unifying a plurality of cutting points on each edge, and registering the cycle inner triangles in the cell for each boundary cell; and (f) using the computer to perform a boundary data division step that includes dividing the boundary data of the object into boundary triangles sharing an adjacent side before performing the cutting point calculation step, wherein, for each boundary cell, the cycle formation step further includes performing the steps of:

(1) extracting a cell edge;

(2) calculating a surface intersection point between a side of the boundary triangle of the boundary data and a cell surface;

(3) calculating an edge intersection point between a face of the boundary triangle and a cell edge;

(4) acquiring continuous cutting segments by connecting two or more of the surface intersection points and the edge intersection point on the same cell surface and on the same boundary triangle in order of proximity;

(5) acquiring a single cutting segment connecting the edge intersection points located at both ends of the continuous cutting segments by deleting the surface intersection points on the same cell surface; and (6) sequentially connecting the cutting segments on the cell surfaces via the edge intersection points to form the closed cutting segment cycle.

7. A program stored in an internal memory of an apparatus, wherein the program executes a method for inputting boundary data of an object to the apparatus that includes a computer operably coupled to receive boundary data from an external data input means, and converting the boundary data by using the computer into cell inner shape data in a cell complex comprising rectangular parallelepiped cells, wherein each rectangular parallelepiped cell has boundary surfaces crossing each other without gaps between the rectangular parallelepiped cells, wherein the program causes the computer to execute the method comprising the steps of:

(a) defining the cell complex that contains the boundary data, and calculating a cutting point where the boundary data cuts an edge or vertex of the rectangular parallelepiped cell of the cell complex;

(b) classifying the rectangular parallelepiped cells into a boundary cell having the cutting point and a nonboundary cell having no cutting point, and acquiring a cutting segment between a cell surface and boundary data for each boundary cell, and forming a cutting segment cycle that is closed by connecting the cutting points and the cutting segments alternately in sequence;

(c) dividing an inside of the cutting segment cycle into cycle inner triangles sharing an adjacent side, for each boundary cell;

(d) unifying a plurality of cutting points on each edge and registering the cycle inner triangles in the cell, for each boundary cell; and (e) dividing the boundary data of the object into boundary triangles sharing an adjacent side before step (a), wherein, for each boundary cell, step (b) further includes performing the steps of:
  (1) extracting a cell edge;
  (2) calculating a surface intersection point between a side of the boundary triangle of the boundary data and a cell surface;
  (3) calculating an edge intersection point between a face of the boundary triangle and a cell edge;
  (4) acquiring continuous cutting segments by connecting two or more of the surface intersection points and the edge intersection point on the same cell surface and on the same boundary triangle in order of proximity;
  (5) acquiring a single cutting segment connecting the edge intersection points located at both ends of the continuous cutting segments by deleting the surface intersection points on the same cell surface; and
  (6) sequentially connecting the cutting segments on the cell surfaces via the edge intersection points to form the closed cutting segment cycle.

* * * * *